(12) United States Patent
Suenobu

(10) Patent No.: US 9,438,838 B2
(45) Date of Patent: Sep. 6, 2016

(54) IMAGING ELEMENT AND IMAGING APPARATUS

(75) Inventor: Kazuhiko Suenobu, Sakura (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 13/819,532

(22) PCT Filed: Aug. 30, 2011

(86) PCT No.: PCT/JP2011/069584
§ 371 (c)(1),
(2), (4) Date: Aug. 30, 2013

(87) PCT Pub. No.: WO2012/029766
PCT Pub. Date: Mar. 8, 2012

(65) Prior Publication Data
US 2013/0341488 A1 Dec. 26, 2013

(30) Foreign Application Priority Data

Aug. 31, 2010 (JP) ................................. 2010-194889

(51) Int. Cl.
*H04N 5/378* (2011.01)
*H01L 27/146* (2006.01)

(52) U.S. Cl.
CPC ........ *H04N 5/378* (2013.01); *H01L 27/14618* (2013.01); *H01L 2924/0002* (2013.01)

(58) Field of Classification Search
CPC .. H04N 5/374; H04N 5/3741; H04N 5/3742; H04N 5/378; H04N 5/335; H01L 27/146; H01L 27/14601; H01L 27/14603; H01L 27/14618; H01L 27/14643

USPC ............ 250/208.1; 348/294, 300, 302, 308; 257/208, 211, 773, 774, 786
See application file for complete search history.

(56) References Cited

U.S. PATENT DOCUMENTS

| | | | | |
|---|---|---|---|---|
| 5,003,380 A | * | 3/1991 | Hirota | H04N 1/486 348/E3.027 |
| 5,137,618 A | * | 8/1992 | Burnett et al. | 205/125 |
| 5,278,660 A | * | 1/1994 | Sugiki | H04N 3/1531 348/281 |
| 5,464,984 A | * | 11/1995 | Cox et al. | 250/370.11 |

(Continued)

FOREIGN PATENT DOCUMENTS

| | | |
|---|---|---|
| JP | A-5-90559 | 4/1993 |
| JP | A-6-302792 | 10/1994 |

(Continued)

OTHER PUBLICATIONS

International Search Report issued in International Application No. PCT/JP2011/069584 on Sep. 27, 2011 (with translation).

(Continued)

*Primary Examiner* — John Lee
(74) *Attorney, Agent, or Firm* — Oliff PLC

(57) ABSTRACT

An imaging element includes a pixel array which has a plurality of pixels arranged in a two-dimensional matrix, and a plurality of signal output terminals which are provided to correspond to the pixel columns of the pixel array and output the signals of the pixels in the pixel columns. In the plurality of signal output terminals, each predetermined number of signal output terminals is arranged as a set in the column direction of the pixel array. The sets of the predetermined number of signal output terminals are arranged in the row direction of the pixel array.

15 Claims, 10 Drawing Sheets

(56) References Cited

U.S. PATENT DOCUMENTS

| | | | |
|---|---|---|---|
| 5,672,902 A * | 9/1997 | Hatanaka et al. | 257/431 |
| 6,476,505 B2 * | 11/2002 | Nakamura | H01L 23/528 257/203 |
| 6,507,384 B1 * | 1/2003 | Endo | H05K 1/118 349/149 |
| 7,071,980 B2 * | 7/2006 | Yuki et al. | 348/308 |
| 7,230,685 B2 * | 6/2007 | Suzuki et al. | 356/4.04 |
| 7,760,315 B2 * | 7/2010 | Onodera | G02F 1/1345 349/149 |
| 7,859,586 B2 * | 12/2010 | Murata et al. | 348/335 |
| 8,144,227 B2 * | 3/2012 | Kobayashi | 348/308 |
| 8,514,308 B2 | 8/2013 | Itonaga et al. | |
| 8,576,318 B2 * | 11/2013 | Lee et al. | 348/313 |
| 2003/0094631 A1 * | 5/2003 | Akram et al. | 257/200 |
| 2005/0001905 A1 * | 1/2005 | Shinomiya | 348/207.99 |
| 2005/0162638 A1 * | 7/2005 | Suzuki et al. | 356/4.04 |
| 2006/0135862 A1 * | 6/2006 | Tootle | A61B 5/04001 600/373 |
| 2006/0207789 A1 * | 9/2006 | Soeta | G01R 1/0483 174/260 |
| 2007/0138509 A1 * | 6/2007 | Onodera | G02F 1/1345 257/203 |
| 2008/0001246 A1 * | 1/2008 | Sengupta | H01L 25/18 257/459 |
| 2008/0042046 A1 | 2/2008 | Mabuchi | |
| 2008/0074704 A1 * | 3/2008 | Ebisawa | H01L 27/14618 358/302 |
| 2008/0088014 A1 * | 4/2008 | Adkisson | H01L 27/14618 257/737 |
| 2008/0135895 A1 * | 6/2008 | Lee | H04N 3/155 257/290 |
| 2008/0231737 A1 * | 9/2008 | Weale | H04N 3/155 257/290 |
| 2008/0237766 A1 * | 10/2008 | Kim | H01L 27/14627 257/432 |
| 2009/0159784 A1 * | 6/2009 | Kobayashi et al. | 250/208.1 |
| 2009/0290058 A1 * | 11/2009 | Miyagawa | H01L 27/14609 348/308 |
| 2009/0295966 A1 * | 12/2009 | Kubo | H04N 5/378 348/308 |
| 2010/0026814 A1 * | 2/2010 | Shimoda | H04N 5/23241 348/207.1 |
| 2010/0033609 A1 * | 2/2010 | Kato | H04N 5/378 348/294 |
| 2010/0149394 A1 * | 6/2010 | Yamazaki et al. | 348/308 |
| 2010/0155922 A1 * | 6/2010 | Pagaila | H01L 21/568 257/686 |
| 2010/0231768 A1 * | 9/2010 | Utsunomiya | H04N 5/374 348/302 |
| 2010/0238334 A1 * | 9/2010 | Takahashi | 348/305 |
| 2010/0259660 A1 * | 10/2010 | Kukita | 348/308 |
| 2010/0259661 A1 * | 10/2010 | Tejada et al. | 348/308 |
| 2010/0259662 A1 * | 10/2010 | Oike et al. | 348/308 |
| 2010/0276572 A1 * | 11/2010 | Iwabuchi | H01L 27/1464 250/208.1 |
| 2011/0025871 A1 * | 2/2011 | Yoshioka | 348/222.1 |
| 2011/0025900 A1 * | 2/2011 | Kondo | 348/308 |
| 2011/0050969 A1 * | 3/2011 | Nishihara | 348/296 |
| 2011/0149136 A1 * | 6/2011 | Johnson | 348/308 |
| 2011/0157443 A1 * | 6/2011 | Yuki et al. | 348/302 |
| 2011/0157445 A1 | 6/2011 | Itonaga et al. | |
| 2011/0194007 A1 * | 8/2011 | Kim et al. | 348/308 |
| 2012/0038809 A1 * | 2/2012 | Lee et al. | 348/308 |
| 2013/0341488 A1 * | 12/2013 | Suenobu | 250/208.1 |
| 2013/0342745 A1 * | 12/2013 | Suenobu | 348/300 |
| 2014/0226049 A1 * | 8/2014 | Utsunomiya | H04N 5/374 348/302 |

FOREIGN PATENT DOCUMENTS

| | | |
|---|---|---|
| JP | A-9-326479 | 12/1997 |
| JP | A-2008-48313 | 2/2008 |
| JP | A-2011-151375 | 8/2011 |

OTHER PUBLICATIONS

Written Opinion of the International Searching Authority issued in International Application No. PCT/JP2011/069584 on Sep. 27, 2011 (with translation).

Jan. 14, 2014 Office Action issued in Japanese Patent Application No. 2010-194889 (with English Translation).

Jun. 9, 2015 Office Action issued in Chinese Patent Application No. 201180037122.2.

* cited by examiner (RELATED ART TYPE)

(RELATED ART TYPE)

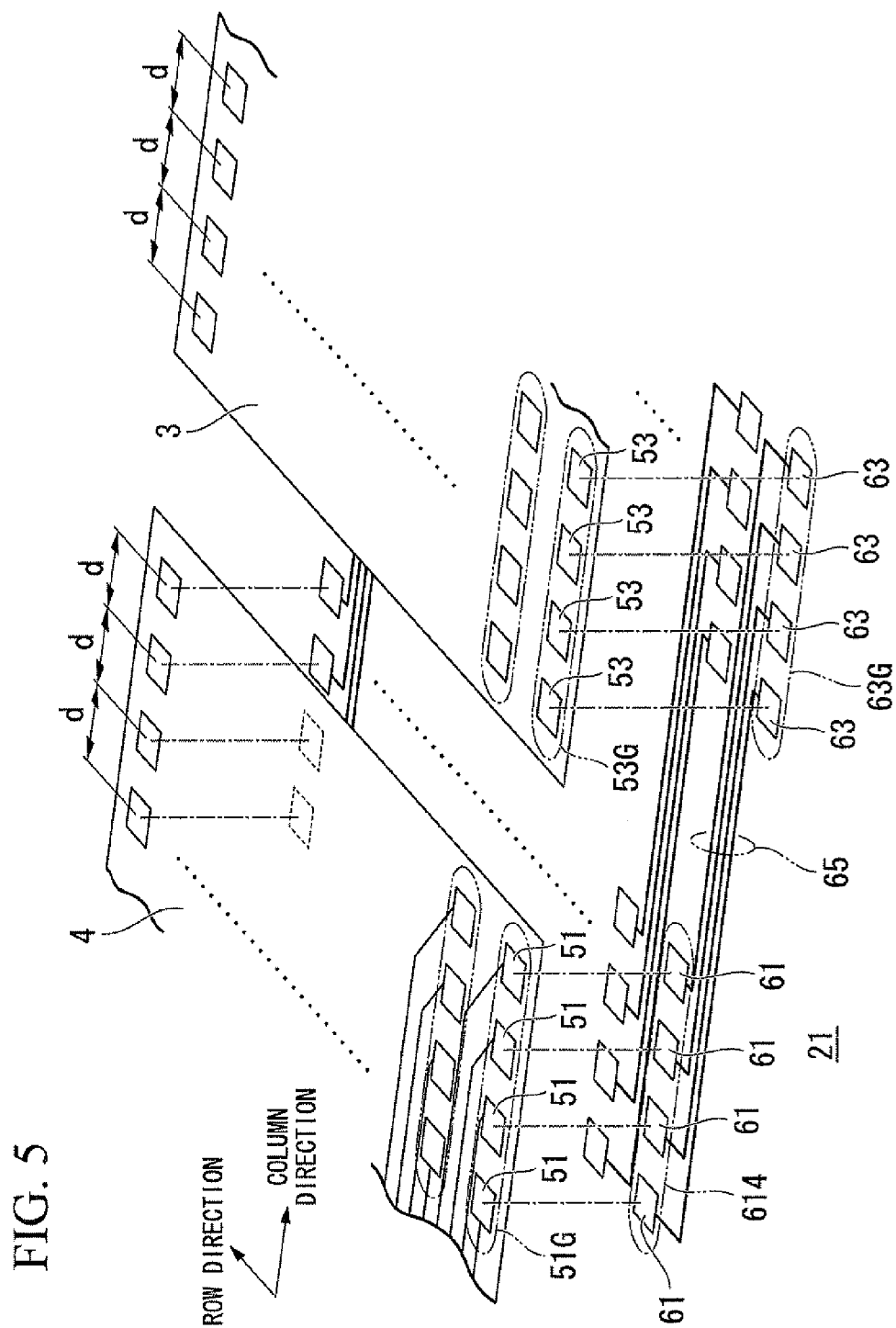

IMAGING ELEMENT AND IMAGING APPARATUS

TECHNICAL FIELD

The present invention relates to an imaging element and an imaging apparatus.

Priority is claimed on Japanese Patent Application No. 2010-194889, filed Aug. 31, 2010, the content of which is incorporated herein by reference.

BACKGROUND ART

In an imaging apparatus which includes a CMOS (Complementary Metal Oxide Semiconductor)-type imaging element (CMOS sensor), it is necessary to capture a high-definition image. An imaging apparatus in which a plurality of imaging elements (semiconductor devices) are combined to achieve multiple pixels so as to capture a high-definition image is known (for example, see Patent Document 1). In such an imaging element, a signal processing unit including an analog-digital converter (column ADC), a preamplifier, and the like is provided for each column of the pixel array unit on the same semiconductor substrate to perform high-speed processing is known.

CITATION LIST

Patent Document

[Patent Document 1] Japanese Unexamined Patent Application, First Publication No. H9-32479

SUMMARY OF INVENTION

Technical Problem

In such an imaging apparatus, instead of combining a plurality of imaging elements (semiconductor devices) each including a pixel array unit, a pixel array unit is formed as a single body, thereby simplifying the structure of the pixel array unit. On the other hand, in the pixel array unit which is formed as a single body to achieve multiple pixels, the amount of image information to be output increases. For this reason, in a signal processing unit which output signals from the pixel array unit, it is necessary to increase the transfer speed of image information. In this way, when the pixel array unit is formed as a single body, the transfer speed increases. The increase in the transfer speed causes an increase in power consumption of the imaging element.

In order to reduce power consumption per semiconductor device in the imaging element formed as a single body, the pixel array unit and the signal processing unit which processes the signals of the pixel array unit may be separated and constituted as different semiconductor devices. Accordingly, it is possible to distribute power consumption of the pixel array unit and the signal processing unit to the semiconductor devices.

In this way, when the pixel array unit and the signal processing unit are separated, the imaging element including the pixel array unit transfers high-definition image information to the semiconductor device including the signal processing unit. Here, the pixel array unit in the imaging element has a matrix structure with rows and columns. For this reason, when transferring the image information, it is necessary that the imaging element outputs the image information from the pixel array unit with multiple pixels through multiple signal lines provided in parallel.

However, in order to output the image information from the pixel array unit through multiple signal lines provided in parallel, signal output terminals of a comparatively large number of signals are required. There may be a limit to the number of signal output terminals to be arranged due to the limited size of the imaging element. Alternatively, the arrangement interval of the signal output terminals in the imaging element may be narrowed. In this way, in the imaging element, if the pixel array unit with multiple pixels is provided separately, there is a problem in that it is difficult to arrange the signal output terminals.

An object of an aspect of the invention is to provide an imaging element and an imaging apparatus in which a plurality of signal output terminals which are provided to correspond to pixel columns of a pixel array can be arranged at an interval wider than an interval of the pixel columns of the pixel array.

Solution to Problem

An imaging element according to an aspect of the invention includes a pixel array which has a plurality of pixels arranged in a two-dimensional matrix, and a plurality of signal output terminals which are provided to correspond to the pixel columns of the pixel array and output the signals of the pixels in the pixel columns, wherein, in the plurality of signal output terminals, each predetermined number of signal output terminals are arranged as a set in the column direction of the pixel array, and the sets of the predetermined number of signal output terminals are arranged in the row direction of the pixel array.

An imaging apparatus according to another aspect of the invention includes the above-described imaging element, and first connection terminals which are provided to correspond to the connecting terminals and are connected to the connecting terminals.

Advantageous Effects of Invention

According to the aspects of the invention, it is possible to provide an imaging element and an imaging apparatus in which a plurality of signal output terminals which are provided to correspond to pixel columns of a pixel array can be arranged at an interval wider than an interval of the pixel columns of the pixel array.

BRIEF DESCRIPTION OF DRAWINGS

FIG. 5 is a bird's eye view showing an aspect of the configuration of a connection unit in this embodiment.

DESCRIPTION OF EMBODIMENTS (Performance and Functional Division Required for Imaging Apparatus)

First, an example of performance and functional division required for an imaging apparatus of this embodiment will be described.

For example, in order to realize a CMOS sensor which can be applied to motion image capturing processing or high-speed image capturing processing, it is necessary to optimize an optical sensor unit (pixel) and a digital signal processing unit which processes signals converted using the optical sensor unit. In this case, it is necessary to optimize the optical sensor unit and the digital signal processing unit corresponding to different types of required performance for the optical sensor unit and the digital signal processing unit. In regard to the optimization of the optical sensor unit, it is necessary to increase a power supply voltage so as to widen a dynamic range with low noise. In regard to the optimization of the digital signal processing unit, a digital circuit which can perform high-speed operation using a minute transistor with a low power supply voltage so as to realize high-speed processing and low power consumption is required. If high-speed processing and low power consumption are realized with a single chip and the same process, a complicated manufacturing process and process control are required. This may cause an increase in the cost of chips and increase difficulty in realization, When a configuration is made with a single chip and the same process, it is necessary to place priority on one kind of required performance.

For example, when a single chip and the same process are used, and the securing of the performance of the optical sensor unit has priority over the securing of the performance of the digital signal processing unit, there is a problem in that the performance of the digital signal processing unit is deteriorated or it is not possible to select a minute process required for high-speed processing, causing an increase in the area of the digital signal processing unit or an increase in power consumption.

On the other hand, there is a technique which combines a plurality of semiconductors to form a multi-chip module. In the multi-chip module, semiconductor chips produced with different processes can be mounted on the same substrate in a bare-chip state. For this reason, in the multi-chip module, it is possible to maintain the features of the processes to improve overall performance.

Hereinafter, in this embodiment, an aspect which realizes high pixelation and high-speed processing of an imaging apparatus with the use of a multi-chip module is shown.

(First Embodiment)

Hereinafter, an imaging apparatus of this embodiment will be described with reference to the drawings.

Figure 1A:
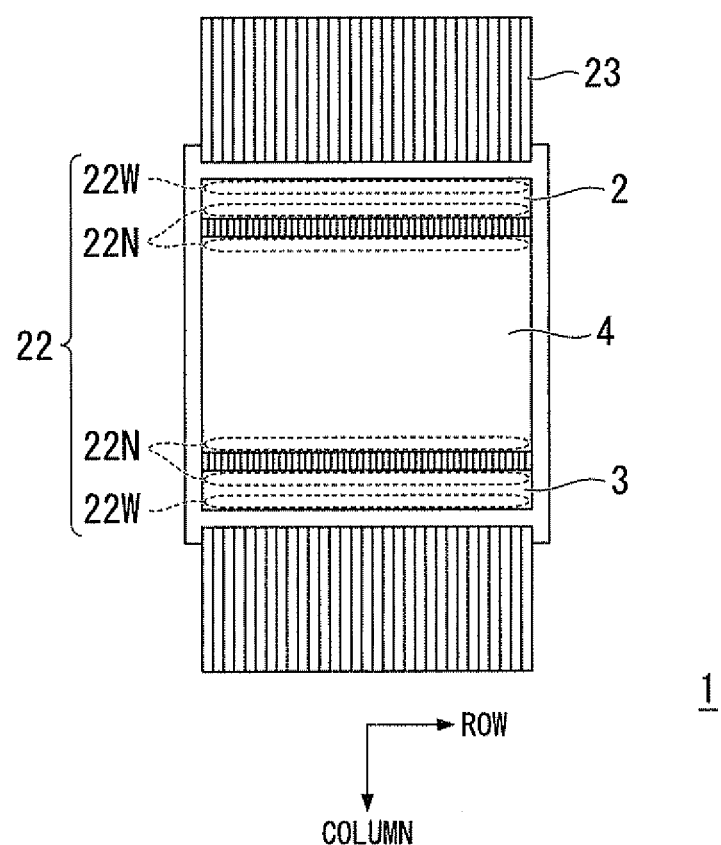
FIG. 1A is a configuration diagram of an imaging apparatus according to an embodiment of the invention.
Figure 1B:
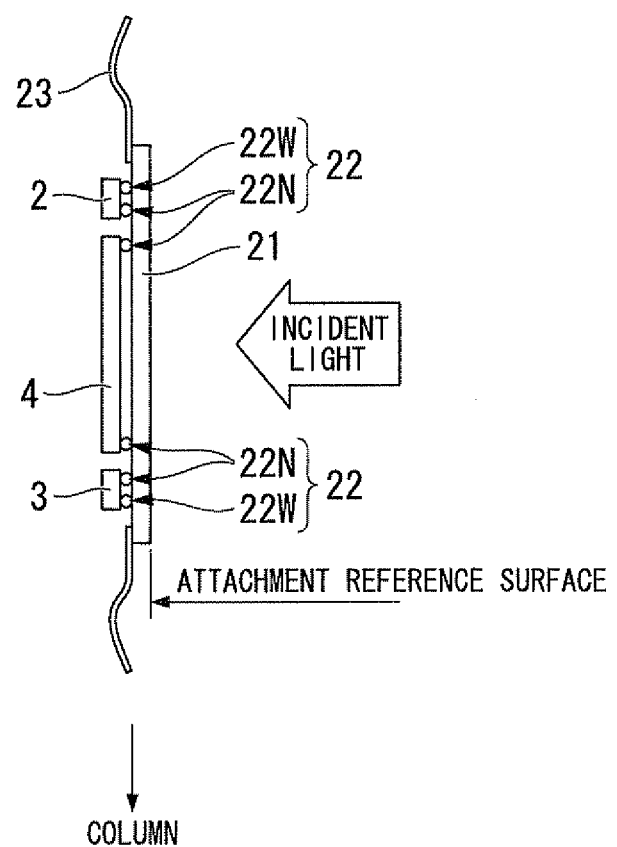
FIG. 1B is a configuration diagram of the imaging apparatus according to the embodiment of the invention.

FIGS. 1A and 1B are configuration diagrams of an imaging apparatus of this embodiment.

FIG. 1A is a front view of the imaging apparatus, and FIG. 1B is a side view of the imaging apparatus.

An imaging apparatus 1 shown in FIGS. 1A and 1B includes a signal processing chip 2, a signal processing chip 3, a sensor chip 4, and a glass substrate 21.

In FIG. 1A, in a state where the surface of the glass substrate 21 of the imaging apparatus 1 is viewed in a front view, the signal processing chip 2 is arranged above the sensor chip 4, and the signal processing chip 3 is arranged below the sensor chip 4.

In FIG. 1A, in regard to a sensor array unit which is provided in the sensor chip 4, it is assumed that a left-right direction with respect to the arrangement direction of pixels arranged two-dimensionally is a row direction, and an up-down direction (a direction perpendicular to the row direction on the paper surface) is a column direction.

The glass substrate 21 is formed of a material (transparent material) which transmits light, and wiring which connects the signal processing chip 2, the signal processing chip 3, the sensor chip 4, and the like are provided on the surface of the glass substrate 21.

The signal processing chip 2, the signal processing chip 3, and the sensor chip 4 are bonded to connection terminals provided on the surface of the glass substrate 21 in bonding regions 22. Each bonding region 22 includes a bonding region 22N where the arrangement density of the connection terminals is high and a bonding region 22W where the arrangement density of the connection terminal is low. In the bonding regions 22N, the signal processing chip 2 and the sensor chip 4 are connected together, and the signal processing chip 3 and the sensor chip 4 are connected together. In the bonding regions 22W, connection from the signal processing chip 2 to a wiring member 23 is made, and connection from the signal processing chip 3 to a wiring member 23 is made. The wiring members 23 are flexible wiring members (FPC) for wiring or the like through which signals are input to and output from the glass substrate 21.

The sensor chip 4 is arranged such that the surface, on which a pixel array is provided, faces the glass substrate 21, The pixel array receives incident light which transmits through the glass substrate 21.

Figure 2:
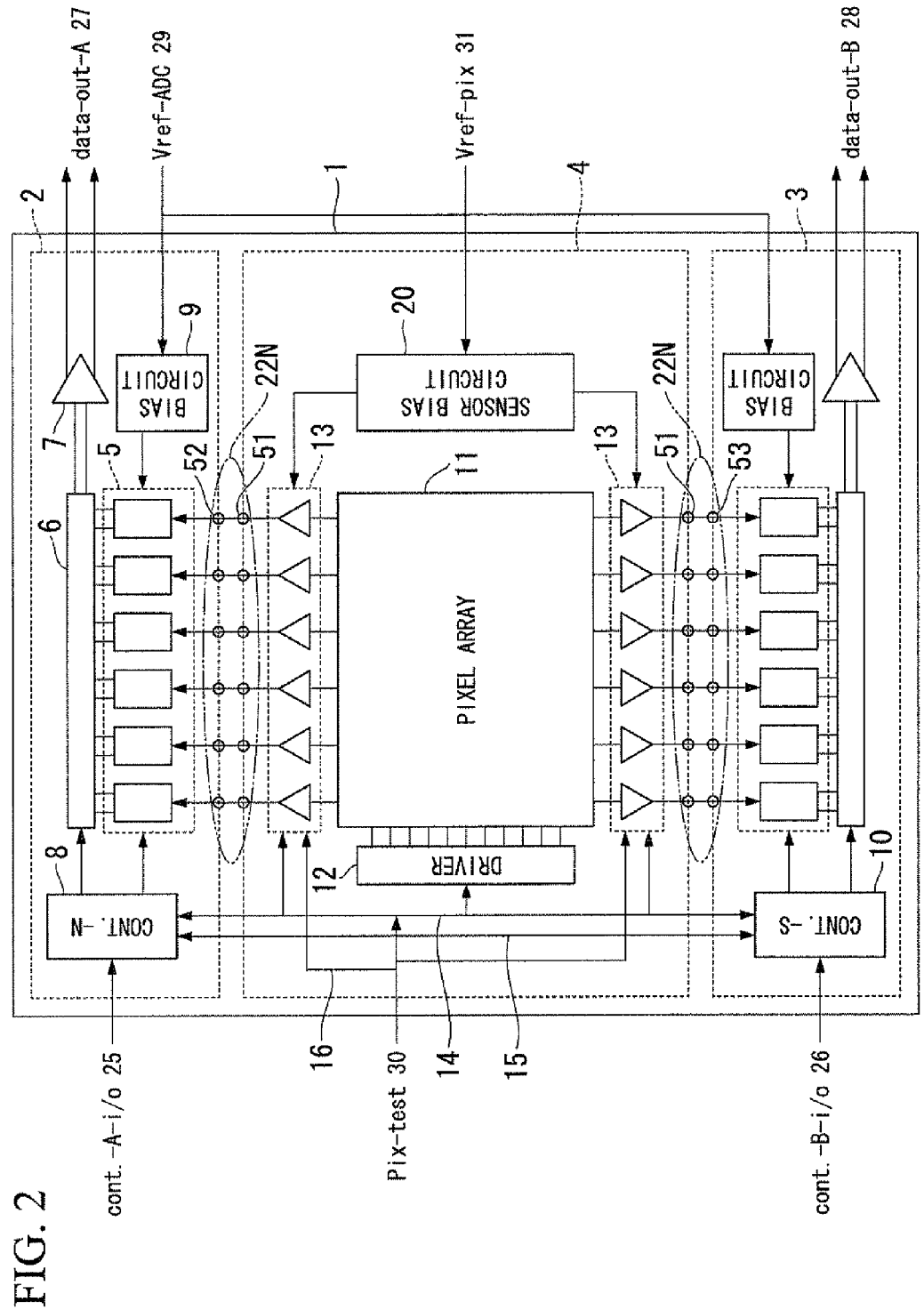
FIG. 2 is a block diagram showing the schematic circuit configuration of an imaging apparatus in this embodiment.

FIG. 2 is a block diagram showing the schematic circuit configuration of the imaging apparatus according to the embodiment of the invention. The same parts as those shown in FIGS. 1A and 1B are represented by the same reference numerals.

The imaging apparatus 1 includes a signal processing chip 2, a signal processing chip 3, and a sensor chip 4.

The signal processing chip 2, the signal processing chip 3, and the sensor chip 4 are connected to connection terminals provided on the surface of the glass substrate 21.

The signal processing chip 2 includes an ADC array 5, a digital output bus 6, a digital small-amplitude differential output circuit 7, a control circuit 8 thereof, and a bias circuit 9 of each circuit.

The ADC array 5 includes a plurality of analog-digital converters (ADCs), and the ADCs perform parallel processing.

The configuration of a circuit block of the signal processing chip 3 is the same as the signal processing chip 2, and as described below, is different from the signal processing chip 2 in that a control circuit 10 is provided.

The sensor chip 4 includes a pixel array 11 where pixels are two-dimensionally arranged, a pixel driver 12, column preamplifiers 13 which are arranged on the upper and lower sides of the pixel array 11 in FIG. 2, a driving control bus 14 of the pixel driver 12, and a sensor bias circuit 20 which supplies a bias voltage or current to each circuit.

Hereinafter, the operation of each unit will be described along an actual image capturing operation.

The pixel array 11 is controlled in accordance with a control signal which is generated in one or both of the control circuit 8 mounted in the signal processing chip 2 and the control circuit 10 mounted in the signal processing chip 3. In the pixel array 11, the control signal from one or both of the control circuit 8 and the control circuit 10 is supplied from the driving control bus 14 to the pixel driver 12. The pixel driver 12 has a plurality of row lines connected to output terminals, and outputs a selection signal for selecting the pixels corresponding to the row line to the row line selected in accordance with the supplied control signal. The pixel driver 12 selects a plurality of pixels, which is connected to the same row line and to which the same selection signal is supplied, for each line (each column). The pixels selected for each column output signals, and supply the signals to the column preamplifiers 13 in parallel for each column, The column preamplifiers 13 correspond to the number of column lines. For example, in FIG. 2, the column preamplifiers 13 are arranged on the upper side of the pixel array 11 in the odd-numbered column lines, and the column preamplifiers 13 are arranged on the lower side of the pixel array 11 in the even-numbered column lines.

The column preamplifiers 13 amplify the signals (pixel signals) from the pixels by a necessary gain. The amplified pixel signals are output from the column preamplifiers 13 of the sensor chip 4 to the signal processing chip 2 or the signal processing chip 3. The amplified pixel signals output from the sensor chip 4 are analog signals which are converted on the basis of the amount of light detected in the pixels.

The amplified pixel signals are input to the signal processing chip 2 in the bonding region 22N on the glass substrate 21 in parallel for each column, and are input to the signal processing chip 3 in the bonding region 22N in parallel for each column.

In the signal processing chip 2 (3), the "amplified pixel signals" output for the columns are analog-digital converted by the ADC array 5 in accordance with the control signal generated by the control circuit 8 (10). The ADC array 5 is controlled in a predefined order controlled by the control circuit 8 (10), and outputs the converted digital signals through the digital output bus 6. The digital small-amplitude differential output circuit 7 outputs the digital pixel signals output from the ADC array 5.

In FIG. 2, one (one lane of) digital small-amplitude differential output circuit 7 is arranged in the signal processing chip 2 (3). Alternatively, a plurality of (a plurality of lanes of) digital small-amplitude differential output circuits 7 may be arranged in accordance with a necessary pixel output speed. In this case, a plurality of digital small-amplitude differential output circuits 7 are controlled such that the output order is switched by the control circuit 8 (10), and signals are output from the digital small-amplitude differential output circuits 7.

Alternatively and/or additionally, the signal processing chips 2 and 3 are embedded with signal processing circuits which execute more advanced digital calculation as necessary as well as analog-digital conversion, and may execute data offset value addition, fixed pattern noise (FPN) subtraction correction, and calculation for correcting variations in conversion errors of a plurality of ADCs in the ADC array 5.

Next, an example of the interlocked operation of a plurality of signal processing chips will be described with reference to FIG. 3.

Figure 3:
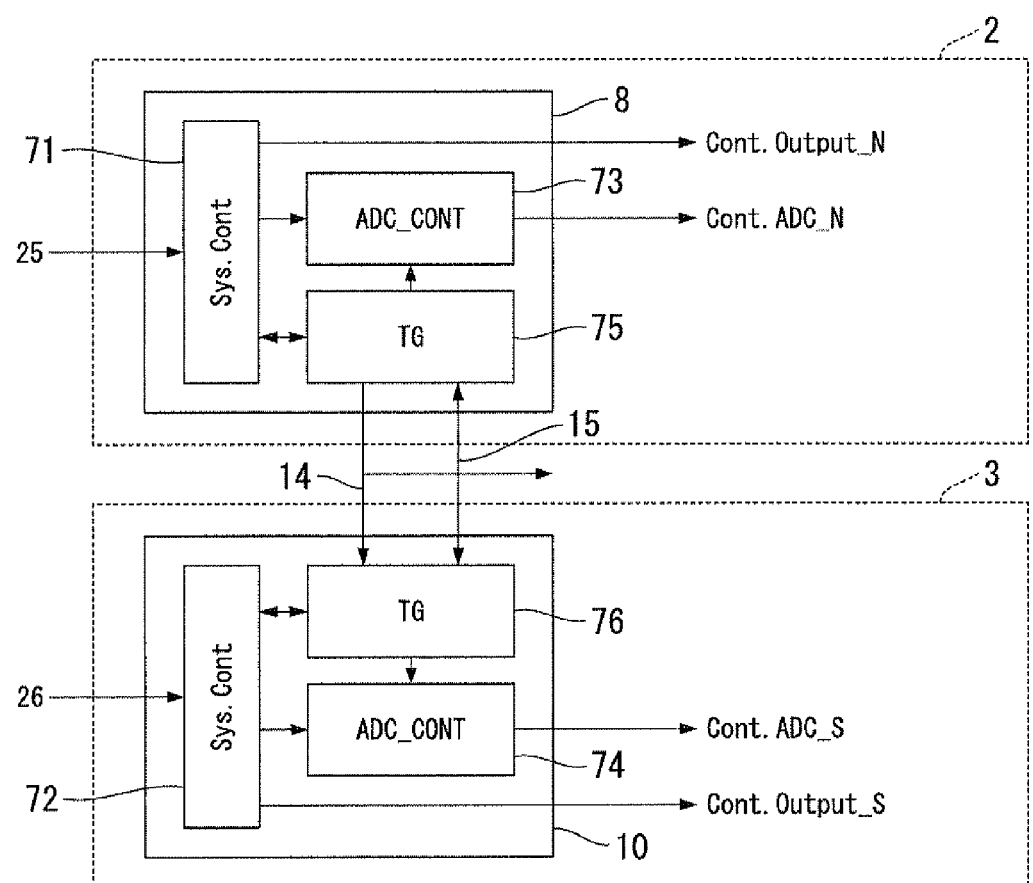
FIG. 3 is a schematic block diagram showing connection between signal processing chips.

FIG. 3 is a schematic block diagram showing connection of a plurality of signal processing chips.

The control circuit 8 in the signal processing chip 2 includes a system controller 71 which receives an input of a specialized control signal 25 (a signal from a specialized control line 25), an ADC controller 73, and a pixel array timing controller 75.

The control circuit 10 in the signal processing chip 3 includes a system controller 72 which receives an input of a specialized control signal 26 (a signal from a specialized control line 26), an ADC controller 74, and a pixel array timing controller 76.

The pixel array timing controllers 75 and 76 are connected to the driving control bus 14 by a synchronous signal line 15.

The control circuit 8 and the control circuit 10 include a common circuit block, and perform different operations depending on the settings of the specialized control lines 25 and 26 connected to the input thereof.

For example, the system controllers 71 and 72, the ADC controllers 73 and 74, and the pixel array timing controllers 75 and 76 can function based on the settings depending on the setting for selecting a master mode and a slave mode.

For example, the units of the control circuit 8 in the signal processing chip 2 are set in the master mode by the specialized control line 25, and the units of the control circuit 10 in the signal processing chip 3 are set in the slave mode by the specialized control line 25.

In this case, the driving control bus 14 is controlled by the pixel array timing controller 75 in the control circuit 8 which is set in the master mode. Simultaneously, the pixel array timing controller 75 controls the synchronization signal line 15. The ADC controller 73 outputs an ADC array control signal (Cont.ADC_N) in synchronization with the clock in the specialized signal line 25 in accordance with an instruction from the system controller 71 and timing control from the pixel array timing controller 75 to control the ADC array. The system controller 71 generates a control signal (Cont.Output_N) synchronized with the clock supplied through the specialized signal line 25 in accordance with timing control by the pixel array timing controller 75. The system controller 71 controls the digital output bus 6 and the digital small-amplitude differential output circuit 7 based on the generated control signal (Cont.Output_N).

The pixel array timing controller 76 in the control circuit 10 which is set in the slave mode does not output signals to the driving control bus 14, and is controlled in the slave mode in which signals are supplied from the driving control bus 14. The pixel array timing controller 76 generates and outputs the control signals of the ADC controller 74 and the system controller 72 in accordance with the control signal supplied from the driving control bus 14 and the synchronization signal supplied from the synchronization signal line 15. The ADC controller 74 generates a DC array control signal (Cont.ADC_S) to match the phase of the clock supplied through the specialized signal line 25 under the control of the system controller 72 and the pixel array timing controller 76. The system controller 71 controls the ADC array based on the generated DC array control signal (Cont.ADC_S). Similarly, the system controller 72 generates a control signal (Cont.Output_S) whose phase is adjusted in synchronization with the clock supplied through the specialized signal line 25 in accordance with the timing control from the pixel array timing controller 76. The system controller 71 controls the digital output bus 6 and the digital small-amplitude differential output circuit 7 based on the generated control signal (Cont.Output_S).

In the above description, a case where the control circuit 8 is set in the master mode, and the control circuit 10 is set in the slave mode has been described. If the setting of the operation mode is changed, the control method may be completely reversed, such that the control circuit 10 may be operated in the master mode and the control circuit 8 may be operated in the slave mode.

When the operation of a stand-alone chip is made during inspection or the like, the chips are operated in stand alone with the master mode.

Although a circuit or a control relationship becomes complicated, the units of the control circuit 8 and the control circuit 10 may be set separately in the master and slave modes.

Next, when the imaging apparatus 1 is divided into a plurality of signal processing chips 2 and 3 and the sensor chip 4, the configuration of a connection unit which connects a plurality of signal processing chips 2 and 3 and the sensor chip 4 will be described with reference to FIGS. 4A to 7.

Initially, an interval of pixels and an interval of signal lines in a sensor chip of the related art will be described.

Figure 4A:
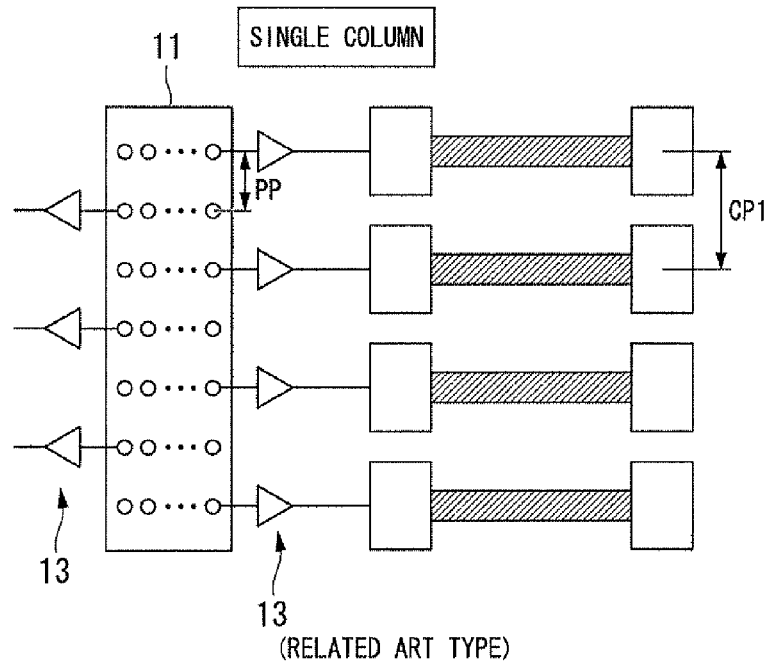
FIG. 4A is a diagram showing the arrangement of connection terminals in the related art.
Figure 4B:
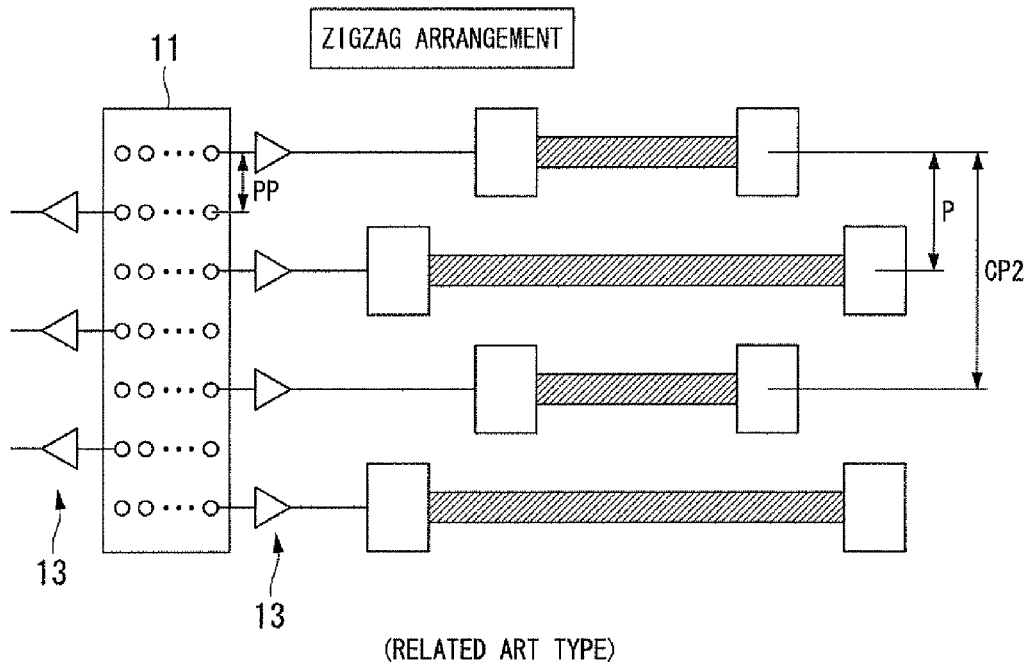
FIG. 4B is a diagram showing the arrangement of connection terminals in the related art.

FIGS. 4A and 4B are diagrams showing the arrangement of connection terminals in the related art.

In FIGS. 4A and 4B, each pixel which is provided in the pixel array of the sensor chip 4 is indicated by a mark "O". The pixels are arranged two-dimensionally, and the interval in which the pixels are arranged in the row direction is indicated by a pixel pitch "PP". Each pixel outputs a signal to a column signal line which is provided to correspond to each pixel. Here, since a case where the direction in which signals are transferred differs between the columns has been described as an example, the number of signals which are output in the same direction can be half the number of pixels which are arranged in the column direction.

In FIG. 4A, a "single column arrangement" in which connection terminals are arranged in line in a direction of arrangement of column signal lines is shown. As shown in this drawing, as the interval (terminal pitch "CP1") of the connection terminals, an interval which is two times (2PP) greater than the pixel pitch can be secured.

In FIG. 4B, a "zigzag arrangement" in which connection terminals are alternately arranged in two lines in a direction of arrangement of column signal lines is shown. As shown in this drawing, as the interval (terminal pitch "CP2") of the connection terminals, an interval which is four times (4PP) greater than the pixel pitch, that is, an interval which is two times greater than the terminal pitch CPI in the "single column arrangement" can be secured.

The reduction in the interval of the connection terminals is limited due to restrictions on required precision or the like for adjusting and arranging the glass substrate 21, the sensor chip 4 arranged on the glass substrate 21, and the like at defined positions.

The reduction in the pixel pitch of the pixels arranged on the pixel array of the sensor chip 4 is limited due to restrictions on required precision or the like for a semiconductor manufacturing process.

In order to achieve high-definition of an image output from the sensor chip 4, multiple pixels are required. When it is difficult to expand the area of the sensor chip 4, it is necessary to achieve multiple pixels in the limited area. For this reason, in the sensor chip 4, it is necessary to further reduce the pixel pitch. in response to the requirement, in the arrangement method of "single column arrangement" or "zigzag arrangement", it is difficult to meet the required precision of the position at which the sensor chip 4 or the like is attached.

In this way, in the configuration of the related art, the sensor chip 4 has a larger number of pixels, making it difficult to achieve high-definition of an image to be obtained. Hereinafter, an embodiment corresponding to high-definition of an image described above will be described.

FIG. 5 is a bird's eye view showing an aspect of the configuration of a connection unit in this embodiment.

In FIG. 5, the signal processing chip 3 and the sensor chip 4 are connected to the glass substrate 21. In FIG. 5, for description, the interval of the signal processing chip 3 and the sensor chip 4 with respect to the glass substrate 21 is shown on a magnified scale.

In the sensor chip 4, the signal lines (a plurality of signal lines) corresponding to the pixel columns of the pixel array having a plurality of pixels arranged in a two-dimensional matrix, and the signal output terminals 51 which are provided to correspond to the signal lines are shown. The column direction of the pixels is substantially perpendicular to the row direction of the pixels.

A plurality of signal output terminals 51 which output the signals from the pixels provided to correspond to the same pixel column are provided one end of the signal lines. The pixels in the pixel array are correspondingly provided at the other end (not shown) of the signal lines.

The signal output terminals 51 are arranged such that a signal output terminal group 51G having a predetermined number of signal output terminals 51 as a set in the column direction of the pixel array is formed.

In the case shown in FIG. 5, each signal output terminal group 51G includes four signal output terminals 51. In each signal output terminal group 51G, the four signal output terminals 51 are arranged at an interval d along the column direction of the pixel array. In this embodiment, in one signal output terminal group 51G, the four signal output terminals 51 are arranged linearly in the column direction of the pixel array.

A plurality of signal output terminal groups 51G are arranged at a predetermined internal in the row direction of the pixel array. In this embodiment, a predetermined number of sets of signal output terminal groups 51G (sets of signal output terminals) are arranged in order in the row direction of the pixel array. The predetermined number of sets becomes the result (quotient) obtained by dividing the number of signal lines which are provided to correspond to the signal output terminals groups 51G by the number of signal output terminals which are provided per set. In this way, if the signal output terminal groups 51G (sets of signal output terminals) are formed, the signal output terminal groups 51G can be arranged in the row direction of the pixel array at an interval obtained by multiplying the pitch of the pixel columns by the predetermined number.

Connection terminal 61 (first connection terminals) are provided to correspond to the signal output terminals 51 on the surface of the glass substrate 21. The connection terminals 61 are connected to the corresponding signal output terminals 51. The connection terminals 61 which are provided to correspond to the signal output terminals 51 included in each signal output terminal group 51G forms a set of connection terminals 61 corresponding to the signal output terminal group 51G. This set is represented by a connection terminal group 61G.

Connection terminals 63 (second connection terminals) are provided to correspond to the connection terminals 61 (first connection terminals). The connection terminals 61 (first connection terminals) and the connection terminals 63 (second connection terminals) which are provided to correspond to each other are connected by signal lines 65.

The connection terminals 63 (second connection terminals) are respectively connected to corresponding signal terminals 53 in the signal processing chip 3.

The connection terminals 63 forms a set which corresponds to a signal terminal group 53G including the corresponding signal terminals 53. This set is represented by a connection terminal group 63G For example, the connection terminals 63 (second connection terminals) can have the same arrangement as the connection terminals 61 (first connection terminals).

The signal lines 65 are arranged between adjacent connection terminal groups 61G (sets of first connection terminals). The signal lines 65 are arranged between adjacent connection terminal groups 63O (sets of second connection terminals).

Figure 6:
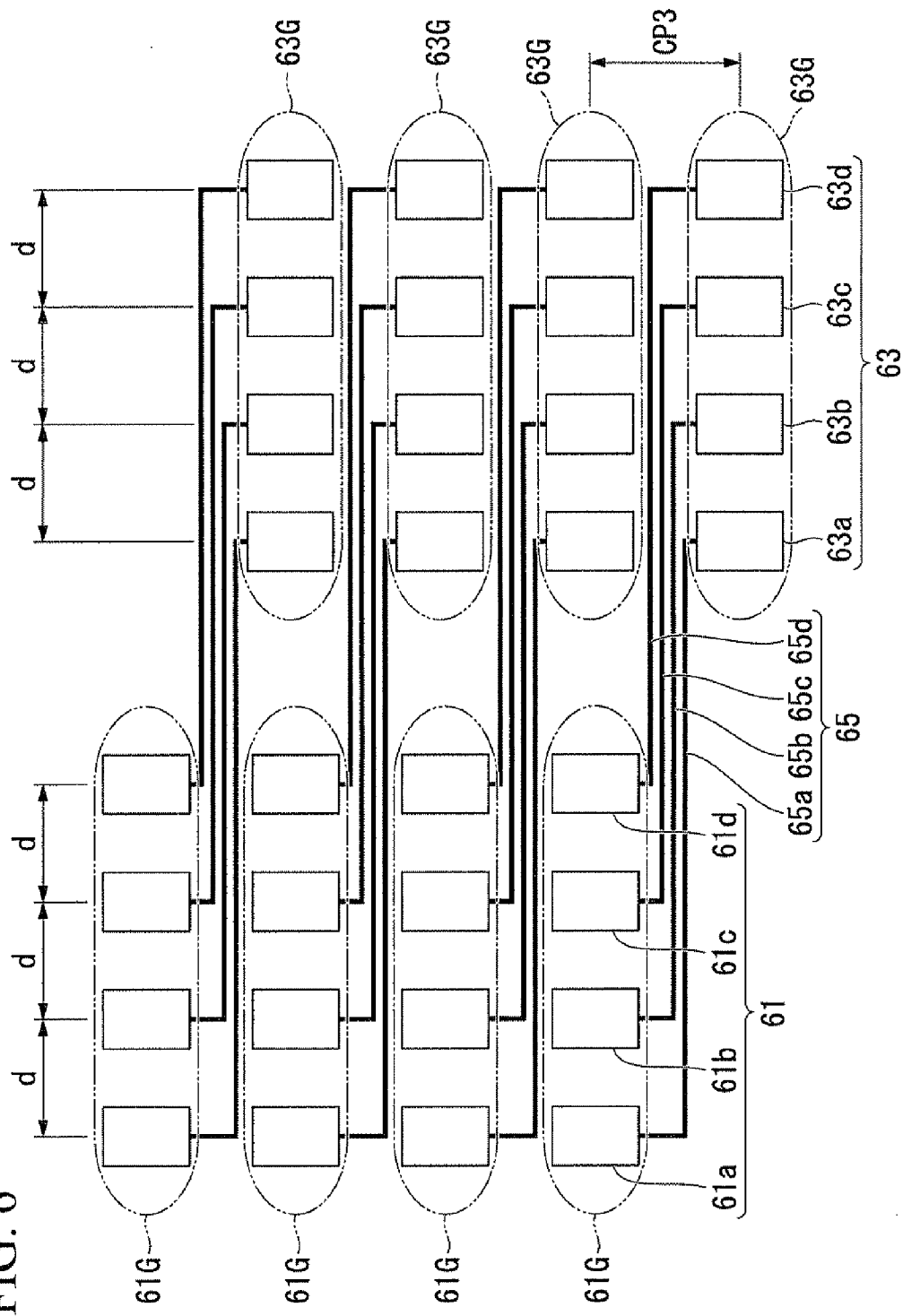
FIG. 6 is a diagram showing an aspect of the arrangement of connection terminals in this embodiment.

FIG. 6 is a diagram showing an aspect of the arrangement of connection terminals in this embodiment. The same parts as those shown in FIG. 5 are represented by the same reference numerals.

FIG. 6 shows connection terminals and a wiring pattern when the surface of the glass substrate 21 is viewed in plan view.

The connection terminal groups 61O and the connection terminal groups 63G are provided to correspond to each other, and are connected together by the signal lines 65. The connection terminal groups 61G and the connection terminal groups 63G which are provided to correspond to each other are arranged at the offset positions in the row direction.

Each connection terminal group 61G includes four connection terminals 61. Each connection terminal group 63O includes four connection terminals 63. FIG. 6 shows four sets of the connection terminal groups 61G and the connection terminal groups 63G arranged in the row direction.

In this drawing, the connection terminals 61 in the connection terminal group 61O are distinguished as connection terminals 61a, 61b, 61c, and 61d. The connection terminals 63 in the connection terminal group 63O are distinguished as connection terminals 63a, 63b, 63c, and 63d.

The connection terminal 61 a is connected to the connection terminal 63a by a signal line 65a. The connection terminal 61b is connected to the connection terminal 63b by a signal line 65b. The connection terminal 61c is connected to the connection terminal 63c by a signal line 65c. The connection terminal 61d is connected to the connection terminal 63d by a signal line 65d.

The connection terminal groups 61G and the connection terminal groups 63G are provided to correspond to the sensor chip 4 and the signal processing chip 3. Of the connection terminals 61a, 61b, 61c, and 61d in each connection terminal group 61G, the connection terminal 61d is arranged at a position closest to the signal processing chip 3. The connection terminals 61c, 61b, 61a are arranged at an interval d in order in a direction away from the connection terminal 61d.

Of the connection terminals 63a, 63b, 63e, and 63d in each connection terminal group 63G, the connection terminal 63a is arranged at a position closest to the sensor chip 4. The connection terminals 63b, 63c, and 63d are arranged at an interval d in a direction away from the connection terminal 63a.

In this way, in the connection of the connection terminal groups 61G and the connection terminal groups 63G, the connection terminals 63 corresponding to the connection terminals 61 are arranged in order in a direction of arrangement of the connection terminals 61 in accordance with the order in which the connection terminals 61 are arranged.

The signal lines 65 are arranged in parallel, and are arranged between adjacent connection terminal groups 61G and between adjacent connection terminal groups 63G The signal lines 65 are arranged through the interval at which the connection terminal groups 61G and the connection terminal groups 63G which are provided to correspond to each other are arranged in the row direction in an offset manner.

With this connection feature, the signal lines 65 have the same wiring length between the connection terminals 61 and the connection terminals 63 which are connected together.

Figure 7:
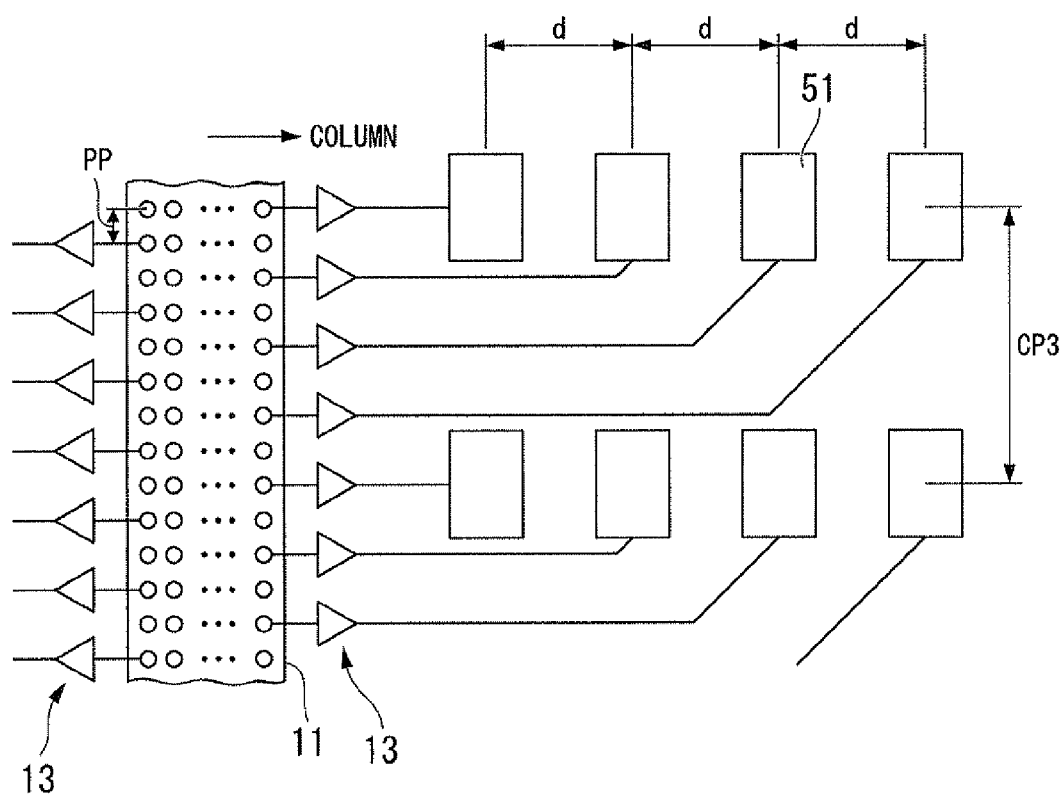
FIG. 7 is a diagram showing the arrangement of connection terminals in this embodiment.

FIG. 7 is a diagram showing the arrangement of connection terminals in this embodiment.

In FIG. 7, each pixel which is provided in the pixel array of the sensor chip 4 is indicated by a mark "O". The pixels are arranged two-dimensionally, and the interval at which the pixels are arranged in the row direction is represented by a pixel pitch "PP". The pixels output signals to corresponding column signal lines. In this embodiment, since a case where the direction in which the signals are transferred differs between the columns, and the signals are supplied to different signal processing chips has been described as an example, the number of signals which are output in the same direction can be half the number of pixels which are arranged in the column direction.

FIG. 7 shows the relationship between the interval of the pixels and the interval of the signal output terminals in the sensor chip 4 when the connection terminals shown in FIGS. 5 and 6 are arranged.

As shown in this drawing, as the interval (terminal pitch "CP3") of the connection terminals in the row direction, an interval (8PP) which is eight times greater than the pixel pitch can be secured.

As described above, in this embodiment, a plurality of signal output terminals 51 which are provided to correspond to the pixel columns of the pixel array 11 can be arranged at an interval wider than the interval of the pixel columns of the pixel array 11, Even when the pixel array 11 in which multiple pixels are achieved and the signal processing units (signal processing chips) 2 and 3 which process the signals of the pixel array 11 are separated and constituted as different semiconductor devices, the interval of the connection terminals in the row direction in the bonding region 22N can be widened with respect to the pixel pitch. Accordingly, the signal output terminals 51 in the sensor chip 4 (imaging element) can be arranged at an interval wider than the interval of the pixel columns of the pixel array 11.

The pixel signals which are output from the sensor chip 4 can be supplied to the signal processing chips 2 and 3, making it possible to provide the imaging apparatus 1 which is formed as a multi-chip module.

(Second Embodiment)

An aspect (second embodiment) different from this embodiment will be described with reference to FIG. 8.

Figure 8:
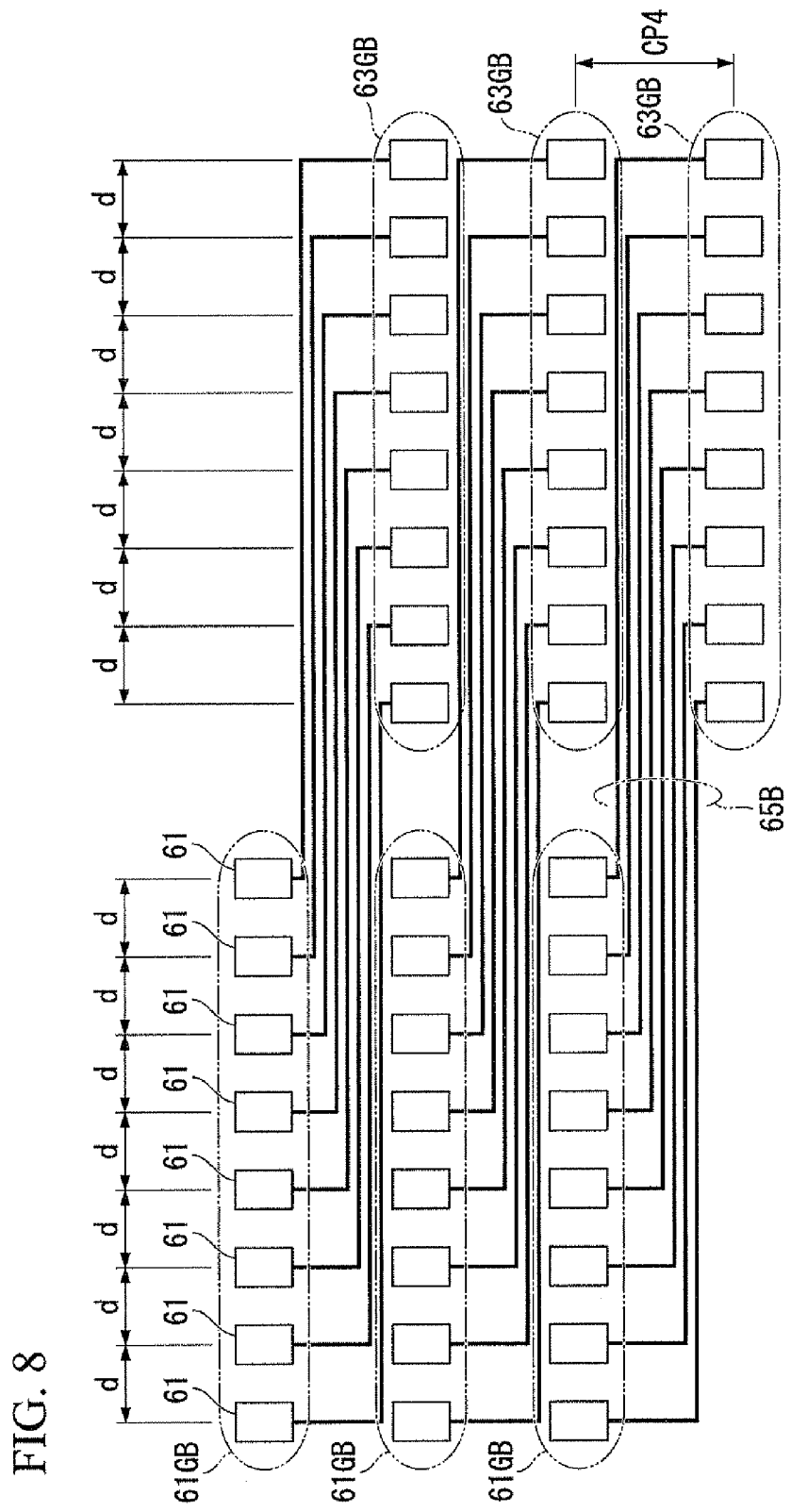
FIG. 8 is a diagram showing an aspect of the arrangement of connection terminals in this embodiment.

FIG. 8 is a diagram showing an aspect of the arrangement of connection terminals in this embodiment. The same parts as those shown in FIG. 5 are represented by the same reference numerals. A connection terminal group 61GB corresponds to the connection terminal group 61G (FIG. 5), a connection terminal group 63GB corresponds to the connection terminal group 63G (FIG. 5), and a signal line 65B corresponds to the signal line 65 (FIG. 5).

FIG. 8 shows connection terminals and a wiring pattern when the surface of the glass substrate 21 is viewed in plan view.

The connection terminal groups 61GB and the connection terminal groups 63GB are provided to correspond to each other, and are connected together by the signal lines 65B. The connection terminal groups 61GB and the connection terminal groups 63GB which are provided to correspond to each other are arranged at the offset positions in the row direction.

Each connection terminal group 61GB includes eight connection terminals 61. Each connection terminal group 63GB includes eight connection terminals 63. FIG. 8 shows three sets of the connection terminal groups 61GB and the connection terminal groups 63GB are arranged in the row direction.

In this way, in this embodiment, each connection terminal group 61GB and each connection terminal group 63GB includes eight connection terminals 61 and eight connection terminals 63, and while the number of connection terminals included in each of the connection terminal groups 61GB and the connection terminal groups 63GB is different, the configuration is the same as in FIG. 5. If the number of connection terminals changes from four to eight, the interval CP4 of the connection terminals in the row direction can be expanded to two times greater than the interval CP3 shown in FIG. 5, that is, 16 times (16PP) greater than the pixel pitch PP.

In this embodiment, the same effects as in the first embodiment can be obtained, and in this embodiment, the interval of the connection terminals in the row direction can be expanded.

If the number of connection terminals is a power of 2, it is possible to simplify the configuration of the circuit.

(Third Embodiment)

An aspect (third embodiment) different from this embodiment will be described with reference to FIG. 9.

Figure 9:
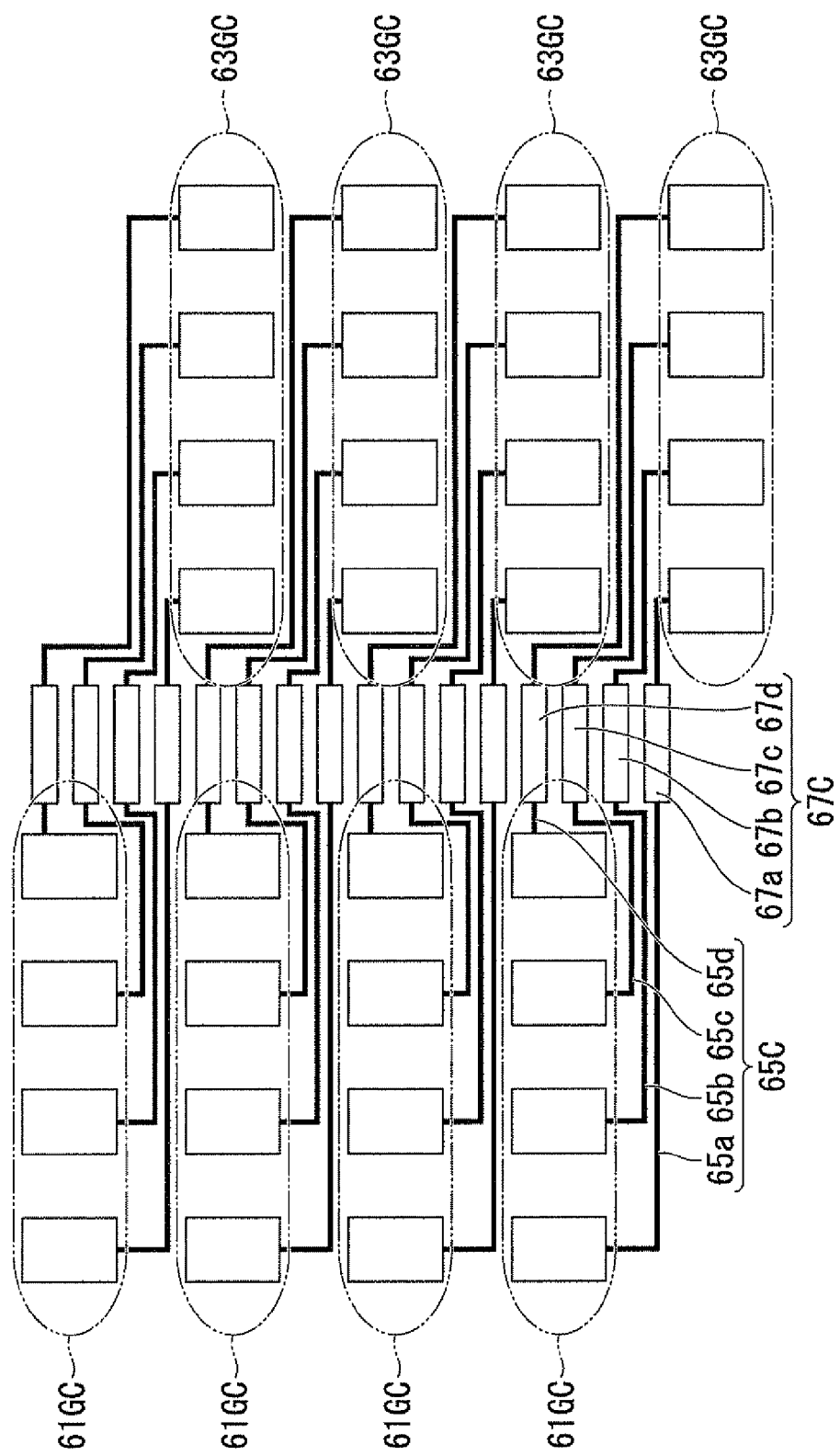
FIG. 9 is a diagram showing an aspect of the arrangement of connection terminals in this embodiment.

FIG. 9 is a diagram showing an aspect of the arrangement of connection terminals in this embodiment. The same parts as those shown in FIG. 5 are represented by the same reference numerals. A connection terminal group 61 GC corresponds to the connection terminal group 61O (FIG. 5), a connection terminal group 63GC corresponds to the connection terminal group 63G (FIG. 5), and a signal line 65C corresponding to the signal line 65 (FIG. 5).

FIG. 9 shows connection terminals and a wiring pattern when the surface of the glass substrate 21 is viewed in plan view.

The connection terminal groups 61 GC and the connection terminal groups 63GC are provided to correspond to each other, and are connected together by the signal lines 65C. The connection terminal groups 61GC and the connection terminal groups 63GC which are provided to correspond to each other are arranged at the offset position in the row direction.

Each connection terminal group 61GC includes four connection terminals 61. Each connection terminal group 63G includes four connection terminals 63. FIG. 9 shows four sets of the connection terminal groups 61GC and the connection terminal groups 63G arranged in the row direction.

Each signal line 65C is provided with an impedance reducing portion 67C for reducing impedance between the connection terminal 61 in the connection terminal group 61GC and the connection terminal 63 in the connection terminal group 63GC.

The impedance reducing portions 67C are impedance reducing portions 67a, 67b, 67c, and 67d which are provided to correspond to the signal lines 65C (65a, 65b, 65c, and 65d), and are arranged in the row direction.

In this way, if the impedance reducing portions 67C are provided, it is possible to reduce an increase in impedance of the minute signal lines 65C. When analog signals are transmitted between the connection terminal groups 61GC and the connection terminal groups 63GC, it becomes possible to secure a wide frequency band of transmittable signals.

According to the above-described embodiment, in the sensor chip 4 and the imaging apparatus 1, the pixel array unit 11 with multiple pixels can be constituted as a semiconductor device different from the signal processing chips 2 and 3, making it possible to efficiently mount the signal output terminals 51 in the sensor chip 4.

In this embodiment, the same effects as in the first embodiment can be obtained. In this embodiment, the output image signals can have a wider bandwidth.

The invention is not limited to the foregoing embodiments, and may be modified without departing from the spirit of the invention. In the imaging element and the imaging apparatus according to the embodiments of the invention, the number of pixels, the number of signals, and the number of connection terminals are just an embodiment, and necessary predetermined values may be appropriately defined.

Although in this embodiment, the signals which are output from the sensor chip 4 have been described, when the control signal and the timing signal for controlling the sensor chip 4 are supplied to the sensor chip 4, it becomes possible to perform the same arrangement of the connection terminals.

REFERENCE SIGNS LIST

1: imaging apparatus, 4: sensor chip, 11: pixel array, 51: signal output terminal, 51G: signal output terminal group

The invention claimed is:

1. An imaging element comprising:
a first pixel configured to generate a first signal by an incident light;
a second pixel configured to generate a second signal by the incident light;
a third pixel configured to generate a third signal by the incident light;
a control line that is a wiring connected to the first pixel, the second pixel, and the third pixel and that is configured to supply a drive signal from a driver to the first pixel, the second pixel, and the third pixel;
a first output terminal configured to output the first signal generated by the first pixel;
a second output terminal configured to output the second signal generated by the second pixel; and
a third output terminal configured to output the third signal generated by the third pixel, wherein:
the second pixel is arranged between the first pixel and the third pixel in a first direction, and
the second output terminal is arranged between the first output terminal and the third output terminal in a second direction different from the first direction.

2. The imaging element according to claim 1, wherein a pitch between the first output terminal and the second output terminal in the second direction is longer than a pitch between the first pixel and the second pixel in the first direction.

3. The imaging element according to claim 1, wherein the first output terminal is configured to output to a first converter that is configured to convert the first signal to a first digital signal, the second output terminal is configured to output to a second converter that is configured to convert the second signal to a second digital signal, and the third output terminal is configured to output to a third converter that is configured to convert the third signal to a third digital signal.

4. The imaging element according to claim 1, further comprising:
a first amplifier arranged between the first pixel and the first output terminal and configured to amplify the first signal;
a second amplifier arranged between the second pixel and the second output terminal and configured to amplify the second signal; and
a third amplifier arranged between the third pixel and the third output terminal and configured to amplify the third signal, wherein
the first output terminal is configured to output the first signal amplified by the first amplifier,
the second output terminal is configured to output the second signal amplified by the second amplifier, and
the third output terminal is configured to output the third signal amplified by the third amplifier.

5. The imaging element according to claim 1, further comprising:
a fourth pixel arranged between the first pixel and the second pixel in the first direction and configured to generate a fourth signal by the incident light; and
a fourth output terminal configured to output the fourth signal generated by the fourth pixel, wherein the fourth output terminal is arranged between the first output terminal and the second output terminal in the second direction.

6. An imaging apparatus comprising:
a first semiconductor element having:
a first pixel configured to generate a first signal by an incident light,
a second pixel configured to generate a second signal by the incident light,
a third pixel configured to generate a third signal by the incident light,
a control line that is a wiring connected to the first pixel, the second pixel, and the third pixel and that is configured to supply a drive signal from a driver to the first pixel, the second pixel, and the third pixel,
a first output terminal configured to output the first signal,
a second output terminal configured to output the second signal, and
a third output terminal configured to output the third signal; and
a second semiconductor element connected to the first semiconductor element and having:
a first converter configured to convert the first signal to a first digital signal,
a second converter configured to convert the second signal to a second digital signal, and
a third converter configured to convert the third signal to a third digital signal, wherein
the second pixel is arranged between the first pixel and the third pixel in a first direction, and
the second output terminal is arranged between the first output terminal and the third output terminal in a second direction different from the first direction.

7. The imaging apparatus according to claim 6, wherein a pitch between the first output terminal and the second output terminal in the second direction is longer than a pitch between the first pixel and the second pixel in the first direction.

8. The imaging apparatus according to claim 6, wherein:
the first semiconductor element includes:
a first amplifier arranged between the first pixel and the first output terminal and configured to amplify the first signal,
a second amplifier arranged between the second pixel and the second output terminal and configured to amplify the second signal, and
a third amplifier arranged between the third pixel and the third output terminal and configured to amplify the third signal, wherein
the first output terminal is configured to output the first signal amplified by the first amplifier to the first converter,
the second output terminal is configured to output the second signal amplified by the second amplifier to the second converter, and
the third output terminal is configured to output the third signal amplified by the third amplifier to the third converter.

9. The imaging apparatus according to claim 6, wherein an area of the first semiconductor element is larger than an area of the second semiconductor element.

10. The imaging apparatus according to claim 6, further comprising:
a substrate arranged to face the first semiconductor element and having
a first wiring which is connected to the first output terminal and the first converter,
a second wiring which is connected to the second output terminal and the second converter, and
a third wiring which is connected to the third output terminal and the third converter, wherein the first pixel, the second pixel and the third pixel receive lights transmitted from the substrate.

11. The imaging apparatus according to claim 6, wherein the first semiconductor element further includes:
a fourth pixel configured to generate a fourth signal by the incident light, and
a fourth output terminal configured to output the fourth signal generated by the fourth pixel, wherein
the fourth pixel is arranged between the first pixel and the second pixel in the first direction, and
the fourth out terminal is arranged between the first output terminal and the second output terminal in the second direction.

12. The imaging apparatus according to claim 11, wherein the second semiconductor element further comprises a fourth converter configured to convert the fourth signal to a fourth digital signal.

13. The imaging apparatus according to claim 12, wherein an area of the first semiconductor element is larger than an area of the second semiconductor element.

14. The imaging apparatus according to claim 11, wherein the first semiconductor element further includes:
a fourth amplifier arranged between the fourth pixel and the fourth output terminal and configured to amplify the fourth signal, wherein the fourth output terminal is configured to output the fourth signal amplified by the fourth amplifier to the fourth converter.

15. The imaging apparatus according to claim 6, further comprising:
    a substrate arranged to face the first semiconductor element and having:
        a first wiring which is connected to the first output terminal and the first converter,
        a second wiring which is connected to the second output terminal and the second converter,
        a third wiring which is connected to the third output terminal and the third converter wherein the first pixel, the second pixel, and the third pixel receive lights transmitted from the substrate.

* * * * *